(12) United States Patent
Lee et al.

(10) Patent No.: US 6,366,149 B1
(45) Date of Patent: Apr. 2, 2002

(54) DELAY CIRCUIT HAVING VARIABLE SLOPE CONTROL AND THRESHOLD DETECT

(75) Inventors: Jong-Cheol Lee, Kangwon-do; Hak-Soo Yu, Seoul, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/649,389

(22) Filed: Aug. 28, 2000

(30) Foreign Application Priority Data

Aug. 26, 1999 (KR) .............................. 99-35679

(51) Int. Cl.[7] .............................. H03H 11/26
(52) U.S. Cl. ...................... 327/276; 327/170; 327/278
(58) Field of Search ................... 327/170, 261, 327/263, 264, 268–272, 276–278, 283, 290; 326/56–58

(56) References Cited

U.S. PATENT DOCUMENTS 5,101,117 A * 3/1992 Johnson et al. ............. 327/250
5,107,153 A * 4/1992 Osaki et al. ................. 327/264
5,963,074 A * 10/1999 Arkin ......................... 327/277

* cited by examiner

Primary Examiner—Kenneth B. Wells
(74) Attorney, Agent, or Firm—Marger Johnson & McCollum, P.C.

(57) ABSTRACT

A delay circuit in accordance with the present invention provides high-resolution changes in the time delay by utilizing a slope controller that generates an intermediate signal having sloping edges in response to edges in an input signal. A delay time controller generates an output signal having edges that begin when the level of the intermediate signal reaches a certain level. The overall time delay of the delay circuit can be varied by varying the slope of the edges of the intermediate signal, or by varying the level of the intermediate signal at which the delay time controller begins generating an edge in the output signal, or by varying both parameters. The slope controller and delay time controller can be realized with a plurality of tri-state inverters coupled in parallel for operating responsive to one or more select signals. By implementing the inverters with pull-up and pull-down transistors having different sizes, the overall time delay can be varied with very high resolution.

26 Claims, 6 Drawing Sheets

DELAY CIRCUIT HAVING VARIABLE SLOPE CONTROL AND THRESHOLD DETECT

This application claims priority from Korean patent application No. 99-35679 filed Aug. 26, 1999 in the name of Samsung Electronics Co., Ltd., which is herein incorporated by reference.

BACKGROUND OF THE INVENTION

1. Field of the Invention

The present invention relates generally to delay circuits, and more particularly, to delay circuits that provide high-resolution delay time control, and memory devices that utilize such delay circuits.

2. Description of the Related Art

Conventional delay circuits utilized a cascade of delayers, each having two serially connected inverters. When many delayers are connected in series, the overall time delay of the circuit is long. When some of the delayers are short circuited, the delay time decreases. However, the resolution of a conventional delay circuit can be no smaller than predetermined delay time of one of the delayers. Thus, it is impossible to provide precise control of the delay time.

When a prior art delay circuit as described above is adapted for use in a semiconductor memory device, it limits the speed at which the memory device can operate because the timing of internal control signals in a semiconductor memory device is an important factor for performing a high speed operation. For example, it is important to generate a precisely timed control signal to enable a sense amplifier to perceive a level difference of a pair of bit lines at the correct time. But as described above, a sense amplifier enable signal generator based on a conventional delay circuit which utilizes serially connected inverters for controlling an enable time cannot provide accurate enough control.

FIG. 1 is a circuit diagram of a prior art conventional delay circuit. The delay circuit comprises switches SW1, SW2, . . . , SW(n) and delayers D1, D2. . . , D(n+1), each of which includes two serially connected inverters(I1, I2), (I3, I4), . . . (I(2n−1), I(2n)), and (I(2n+1), I(2n+2)). The delayers D1, D2, . . . D(n) are connected in parallel with the switches SW1, SW2, . . . SW(n), respectively. When the switches SW1, SW2, . . . SW(n) are turned on, the input signal IN is delayed as long as a delay time of delayer D(n+1). When the switches SW1, SW2, . . . SW(n) are turned off, the input signal IN is delayed as long as the delay time of all the delayers D1, D2, . . . D(n+1) combined. That is, the delay time of the input signal IN is maximized. When the switch SW1 is turned off and other switches SW2, SW3, . . . SW(n) are turned on, the input signal IN is delayed as long as the delay time of the delayers D1 and D(n+1).

Accordingly, with the delay circuit illustrated in FIG. 1, it is possible to increase or decrease the delay time by an amount equal to the delay time of one of the individual delayers. But, it is impossible to change the overall delay time by an amount of time that is smaller than the delay time of one of the individual delayers. This is especially problematic when trying to control the enable time of a sense amplifier enable signal generated by an sense amplifier enable signal generator in a semiconductor memory device.

SUMMARY OF THE INVENTION

One aspect of the present invention is a delay circuit comprising a slope controller for generating an intermediate signal responsive to an input signal, and a delay time controller coupled to the slope controller for generating an output signal responsive to the intermediate signal. The slope controller is constructed so as to control the slope of the intermediate signal responsive to one or more first select signals, and the delay time controller is constructed such that the delay time between an edge of the input signal and a corresponding edge of the output signal depends on the slope of the intermediate signal.

In another aspect of the present invention, a delay circuit comprises a slope controller for generating an intermediate signal responsive to an input signal, and a delay time controller coupled to the slope controller for generating an output signal responsive to the intermediate signal. The intermediate signal has a slope, and the delay time controller is constructed such that the delay time between the edge of the input signal and the corresponding edge of the output signal is responsive to one or more select signals.

Another aspect of the present invention is a delay circuit comprising slope controller means for generating an intermediate signal responsive to an input signal, and delay time controller means coupled to the slope controller for generating an output signal responsive to the intermediate signal. The delay time between an edge of the input signal and a corresponding edge of the output signal depends on the slope of the intermediate signal.

DETAILED DESCRIPTION

Figure 1:
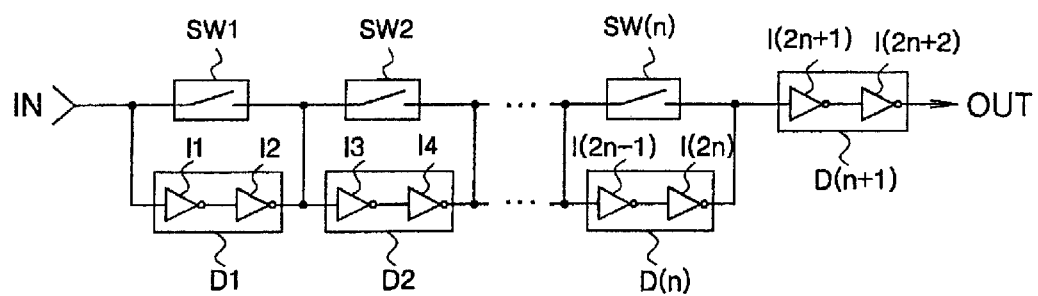
FIG. 1 is a circuit diagram of a prior art delay circuit.
Figure 2:
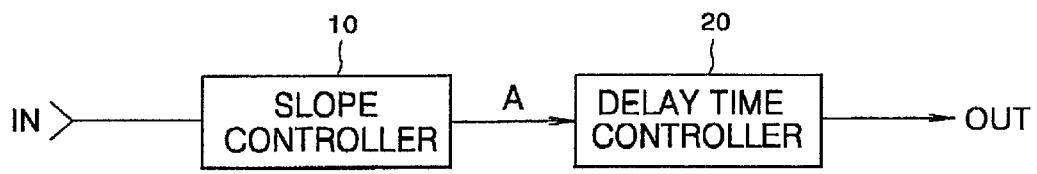
FIG. 2 is a block diagram of an embodiment of a delay circuit in accordance with the present invention.

FIG. 2 is a block diagram of an embodiment of a delay circuit in accordance with the present invention. The delay circuit includes a slope controller 10, which generates an intermediate signal A responsive to an input signal IN, and a delay time controller 20, which generates an output signal OUT responsive to the intermediate signal A. The slope controller 10 generates sloping edges in the intermediate signal A responsive to edges in the input signal IN. The delay time controller 20 generates edges in the output signal OUT that begin when the level of the intermediate signal A reaches a certain level. Together, the slope controller 10 and delay time controller 20 can provide minute changes in the time delay by either varying the slope of the edges of the intermediate signal A, or by varying the level of the signal A at which the delay time controller begins generating an edge in the output signal, or by varying both parameters.

Figure 3:
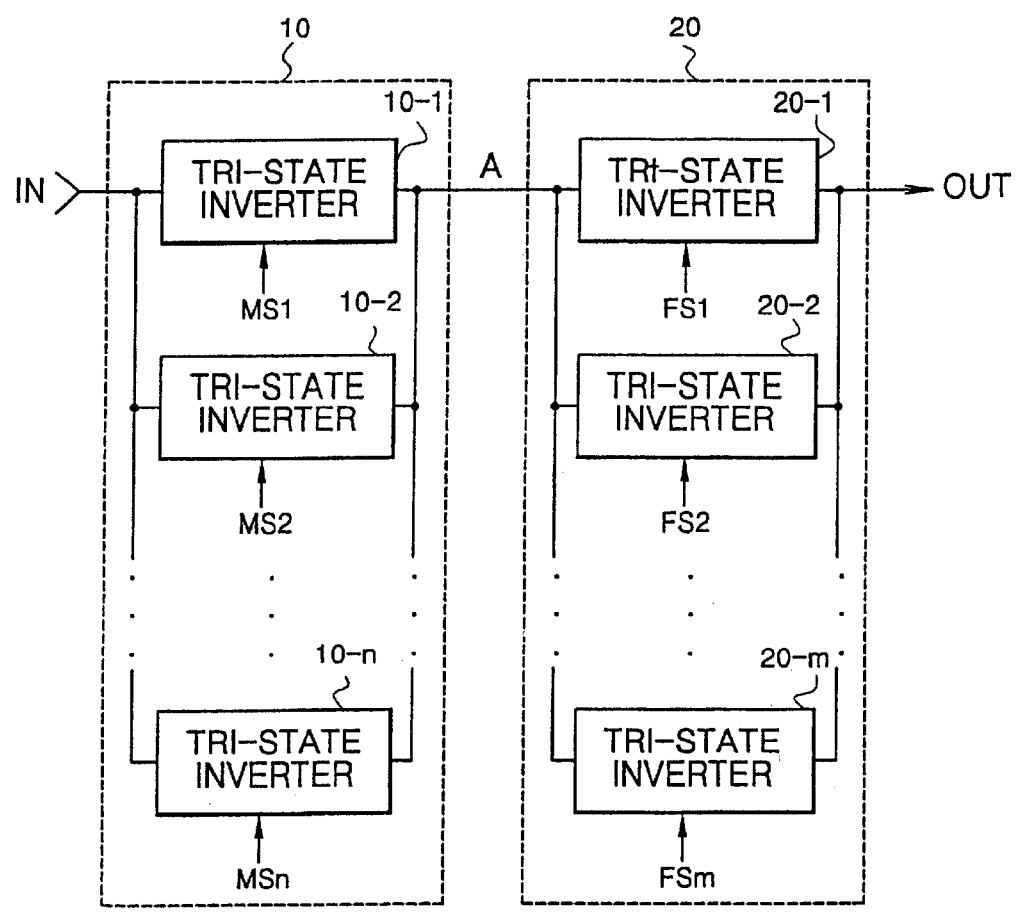
FIG. 3 is a block diagram showing a more detailed embodiment of a delay circuit in accordance with the present invention.

FIG. 3 is a block diagram showing a more detailed embodiment of a delay circuit in accordance with the present invention. The details shown in FIG. 3 are an example of details that can be used to implement the embodiment of FIG. 2, but the embodiment of FIG. 2 is not limited to the details of FIG. 3. Referring again to FIG. 3, a slope controller 10 comprises n tri-state inverters 10-1, 10-2, . . . 10-n, which are enabled in response to n select signals MS1, MS2, MSn, respectively. The delay time controller 20 comprises m tri-state inverters 20-1, 20-2, . . . 20-m which are enabled in response to m select signals FS1, FS2, . . . FSm, respectively.

The operation of the blocks shown in FIG. 3 will now be described. The slope of the intermediate signal A depends on how many of the n tri-state inverters 10-1, 10-2, . . . 10-n are enabled by the select signals MS1, MS2, . . . MSn. Since there are n inverters, the signal A can have $2^n-1$ different slopes. (No edges are generated in the signal A if no inverters are enabled.) The level of the signal A at which the delay time controller begins an edge in the output signal OUT depends on how many of the m tri-state inverters 20-1, 20-2, . . . 20-m are enabled. Since there are m inverters, the delay time controller can begin an edge in the output signal OUT at $2^m-1$ different times for a given intermediate signal A. (No edges are generated in the output signal OUT if no inverters are enabled.)

If the delay circuit of FIG. 3 is to be used primarily in response to falling edges of the input signal IN, then in a practical embodiment, the tri-state inverters in the slope controller 10 are preferably implemented with NMOS pull-down transistors that are the same size, and PMOS pull-up transistors that are different sizes. This allows the slope controller 10 to generate rising edges in the intermediate signal A having $2^n-1$ different slopes depending on the state of the select signals MS1, MS2, . . . MSn. Also, the delay time controller 20 is preferably implemented with NMOS pull-down transistors that are different sizes, and PMOS pull-up transistors that are the same size. This allows the delay time controller 20 to generate a falling edge in the output signal OUT having $2^m-1$ different delay times for a given slope in the rising edge of the intermediate signal A.

In contrast, if the delay circuit of FIG. 3 is to be used primarily in response to rising edges of the input signal IN, then in a practical embodiment, the tri-state inverters in the slope controller 10 are preferably implemented with NMOS pull-down transistors that are different sizes, and PMOS pull-up transistors that are the same size, and the delay time controller 20 is preferably implemented with NMOS pull-down transistors that are the same size, and PMOS pull-up transistors that are different sizes. Then, by controlling the states of the select signals MS1, MS2, . . . MSn and FS1, FS2, . . . FSm, the slope controller 10 can generate falling edges in the intermediate signal A having $2^n-1$ different slopes, and the delay time controller 20 can provide $2^m-1$ different delay times for each slope in the falling edge the signal A.

Although the circuit of FIG. 3 is illustrated with tri-state inverters, other devices can be used. For example, Schmitt triggers can be used in place of the inverters.

Figure 4:
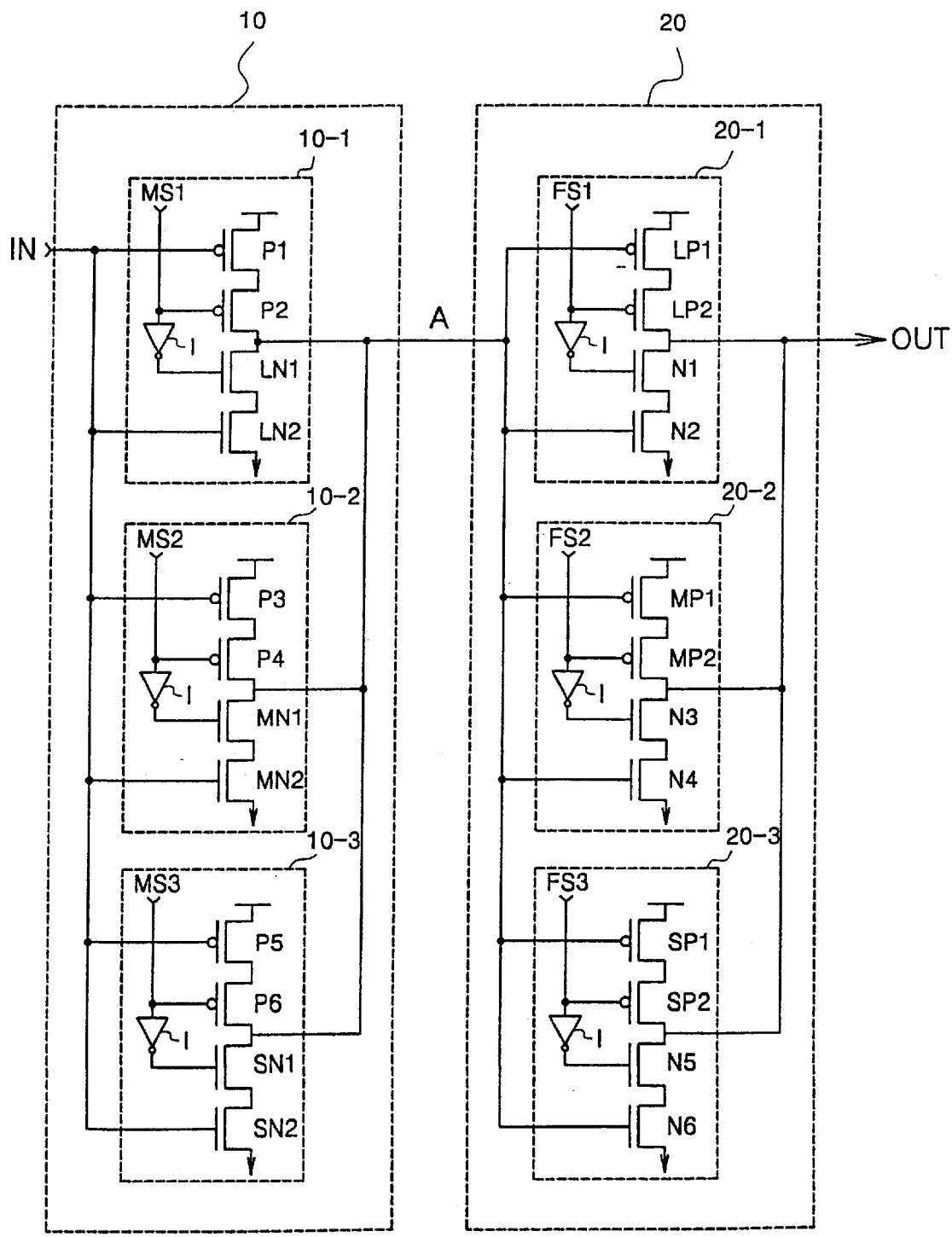
FIG. 4 is a schematic diagram showing a more detailed embodiment of a delay circuit in accordance with the present invention.

FIG. 4 is a schematic diagram showing a more detailed embodiment of a delay circuit in accordance with the present invention. FIG. 4 shows an example of details that can be used to implement the embodiment of FIG. 3, but the embodiment of FIG. 3 is not limited to the details of FIG. 4.

The delay circuit of FIG. 4 includes a slope controller 10 which has three tri-state inverters 10-1, 10-2 and 10-3, and a delay time controller 20 which has three tri-state inverters 20-1, 20-2 and 20-3. Each of the tri-state inverters 10-1, 10-2, 10-3, 20-1, 20-2 and 20-3 includes two PMOS transistors, two NMOS transistors and an inverter I. The tri-state inverters 10-1, 10-2 and 10-3 include PMOS transistors P1, P2, P3, P4, P5 and P6, all of which are the same size, NMOS transistors LN1 and LN2 which are a large size, NMOS transistors ML1 and ML2 which are a medium size, and NMOS transistors SN1 and SN2 which are a small size. The tri-state inverters 20-1, 20-2 and 20-3 include NMOS transistors N1, N2, N3, N3, N5 and N6, all of which are the same size, PMOS transistors LP1 and LP2 which are a large size, PMOS transistors MP1 and MP2 which are a medium size, and PMOS transistors SP1 and SP2 which are a small size.

An operation of the circuit shown in FIG. 4 will now be described. When the input signal IN is rising, the slope of the falling edge of the signal A depends on the state of the select signals MS1, MS2 and MS3. That is, when all of the select signals MS1, MS2, and MS3 are at a low level, all three of the tri-state inverters 10-1, 10-2 and 10-3 are enabled, and all of the NMOS transistors LN1, LN2, MN1, MN2, SN1 and SN2 are turned on. Therefore, the falling edge of the signal A has a large slope. In contrast, when the select signals MS1, MS2 and MS3 are at "high", "high" and "low" levels, respectively, two tri-state inverters 10-1 and 10-2 are disabled and one tri-state inverter 10-3 is enabled. Therefore, the slope of the falling edge of the signal A is decreased. When all of the select signals MS1, MS2 and MS3 are at a high level, the input signal IN is not transmitted to the intermediate signal A. Accordingly, the slope controller 10 shown in FIG. 4 can generate the signal A having seven different slopes.

When the intermediate signal A is falling in response to a rising edge of the input signal IN, the delay time of the corresponding rising edge output signal OUT changes according to the state of the select signals FS1, FS2 and FS3. That is, when all of the select signals FS1, FS2 and FS3 are at a low level, the tri-state inverters 20-1, 20-2 and 20-3 are all enabled, and all of the PMOS transistors LP1, LP2, MP1, MP2, SP1 and SP2 are turned on. Thus, the combined effect of the pull-up transistors is that of one very large pull-up transistor, and the rising edge of the output signal OUT begins when the signal A is still at a relatively high level. That is, time delay caused by the delay time controller is short.

When the select signals FS1, FS2 and FS3 are at "high", "high" and "low" levels, respectively, the tri-state inverters 20-1 and 20-2 are disabled and the tri-state inverter 20-3 is enabled so that only the PMOS transistors SP1 and SP2 are turned on. Therefore, the effective combined size of the pull-up transistors is small, and the rising edge of the output signal OUT does not begin until the signal A reaches a relatively low level. That is, the time delay caused by the delay time controller is long. When all of the select signals FS1, FS2 and FS3 are at a high level, the signal A can not be transmitted. Accordingly, the delay time controller 20 shown in FIG. 4 can generate the output signal OUT having seven different delay times for each slope of the intermediate signal A.

Therefore, the overall combination of the slope controller 10 and the delay time controller 20 can provide 49 different delay times between the rising edge of the input signal IN and the rising edge of the output signal OUT.

The embodiment of a delay circuit described in FIG. 4 is preferable when a time delay must be controlled from a rising edge of the input signal IN. If the time delay must be controlled from a falling edge of the input signal, the slope controller 10 should be implemented with tri-state inverters having PMOS transistors of different sizes and NMOS transistors of the same size, and the delay time controller 20 should be implemented with tri-state inverters having NMOS transistors of different sizes and PMOS transistors of the same size.

Figure 5:
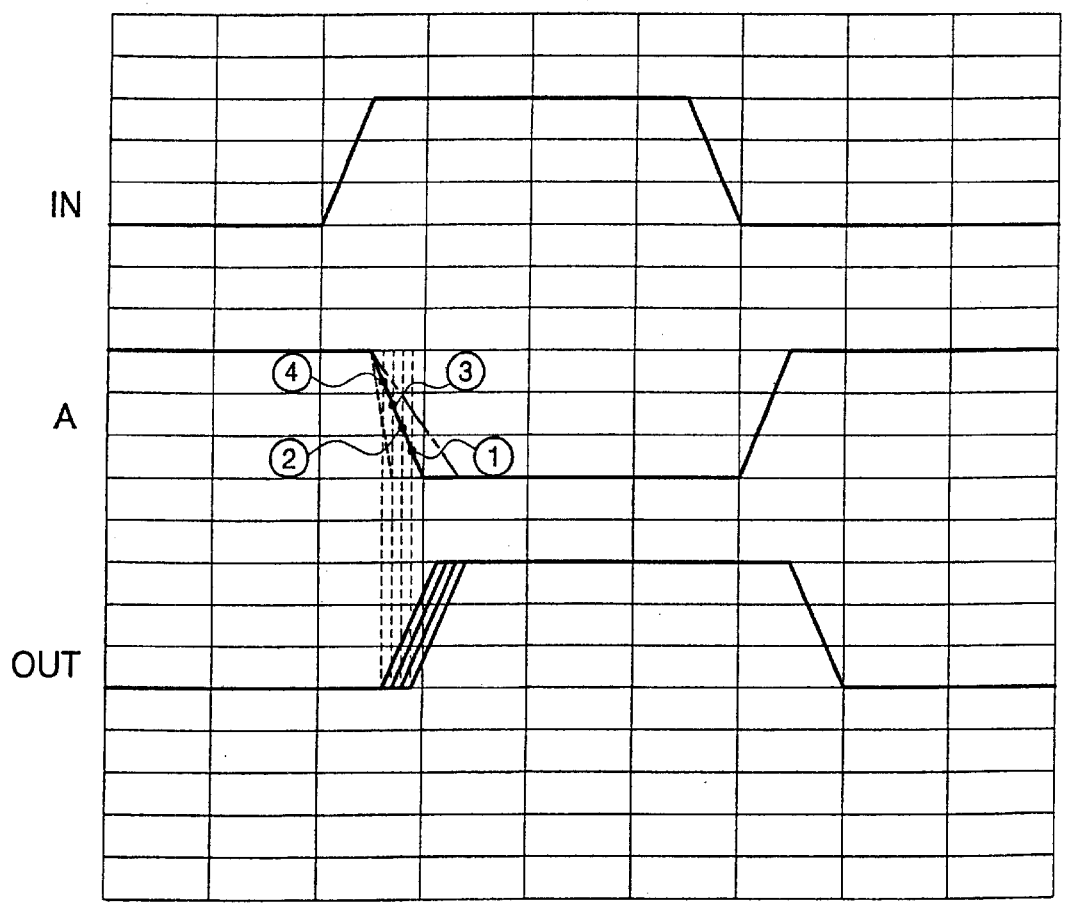
FIG. 5 is a timing diagram illustrating one mode of operation of an embodiment of a delay circuit in accordance with the present invention when input signal is rising.

FIG. 5 is a timing diagram illustrating the operation of the slope controller shown in FIG. 4 when the input signal IN is rising. FIG. 5 shows how the slope controller 10 varies the slope of the intermediate signal A in response to the select signals MS1, MS2 and MS3, and also shows how the delay time controller 20 varies the time delay for the rising edge of the output signal OUT in response to changes in the select signals FS1, FS2 and FS3.

The slope controller 10 generates the signal A having a slope shown as either a solid line, a dotted line, or a chain line depending on the state of the select signals that are applied to the tri-state inverters of the slope controller 10. When many tri-state inverters are selected, the signal A has a slope as shown with the dotted line. When only a few tri-state inverters are selected, the signal A has a slope as shown with the chain line.

The delay time controller 20 generates the output signal OUT having various delay times depending on the states of the select signals applied to the tri-state inverters of the delay time controller 20. The four different example rising edges of the output signal OUT shown in FIG. 5 are generated by the delay time controller 20 in response to the falling edge of the signal A having a slope shown in a solid line. That is, the delay time controller 20 can generate the different rising edges of the output signal OUT even though the slope of the signal A is held constant. Specifically, when many of the tri-state inverters in the delay time controller are selected, the delay time controller begins the rising edge of the output signal when the signal A is still at a relatively high level as shown at point (4). Thus, the output signal has a rising edge as shown at the left of FIG. 5, and the overall delay time between the rising edge of IN and the rising edge of OUT is short. As fewer of the tri-state inverters are selected, the delay time controller does not begin the rising edge of the output signal until the signal A reaches lower and lower points as shown at point (3), (2), and (1). Thus, the rising edge of output signal moves further to the right of FIG. 5 as fewer inverters are selected, and the overall delay time between the rising edge of IN and the rising edge of OUT increases.

From this, it is apparent that the present invention can change the delay time between an edge of IN and the corresponding edge of OUT by either holding the delay time of the delay time controller constant and changing the slope of A (which provides 7 different delay times in the embodiment of FIG. 4), or by holding the slope of A constant and changing the delay time of the delay time controller (which provides 7 different delay times in the embodiment of FIG. 4), or by a combination of both (which provides a combined total of 49 different delay times in the embodiment of FIG. 4). This is a very flexible solution that provides very fine (high resolution) control of the overall delay time.

Figure 6:
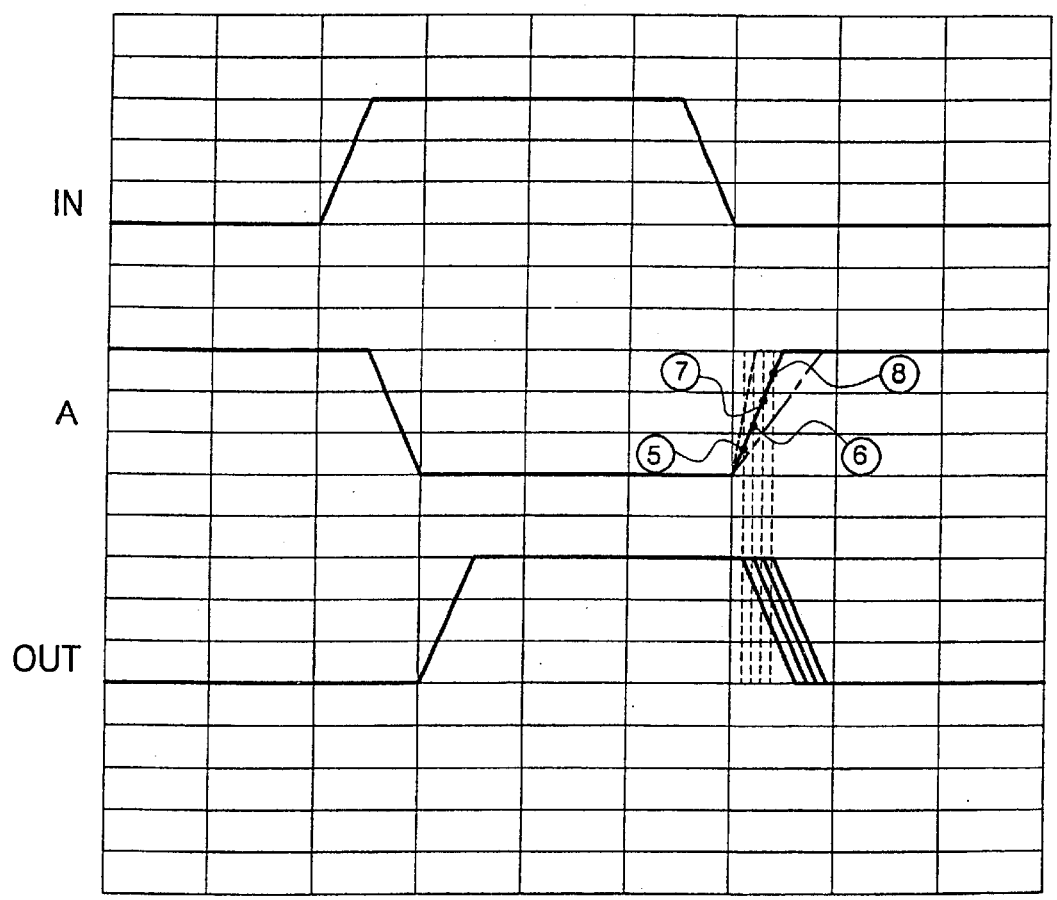
FIG. 6 is a timing diagram illustrating one mode of operation of an embodiment of a delay circuit in accordance with the present invention when the input signal is falling.

FIG. 6 is a timing diagram that illustrates the operation of an embodiment of a delay circuit in accordance with the present invention in response to a falling edge of the input signal IN. The slope controller 10 generates the intermediate signal A having the slopes shown in a solid line, a dotted line and a chain line depending on the states of the select signals input to the slope controller. The delay time controller 20 generates the output signal OUT which has a falling edge that begins at points (5), (6), (7), and (8) of the signal A having a slope shown in a solid line. The point (5), (6), (7), or (8) at which the falling edge of OUT begins depends on the states of the select signals applied to the delay time controller 20.

Figure 7:
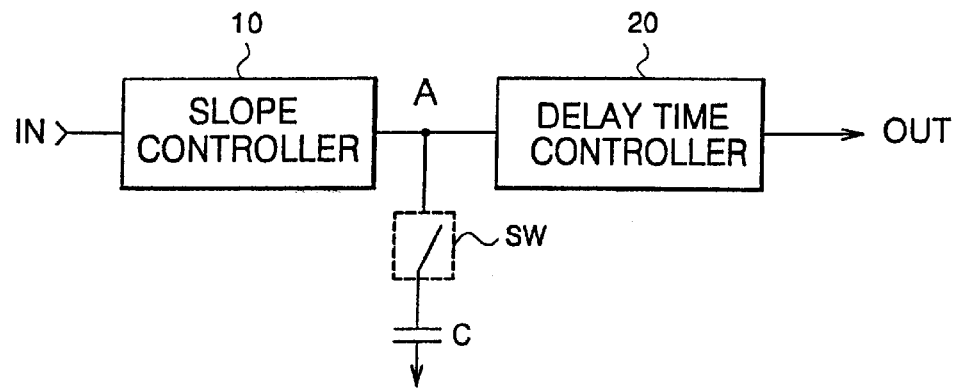
FIG. 7 is a block diagram of another embodiment of a delay circuit in accordance with the present invention.

FIG. 7 is a block diagram illustrating another embodiment of a delay circuit according to the present invention. The delay circuit of FIG. 7 is similar to that of FIG. 2 but includes a capacitor C having a first terminal connected to a power supply ground terminal GND and a second terminal connected to output terminal of the slope controller 10 through a switch SW. When the switch SW is closed, the slope of the output signal A is decreases.

Figure 8:
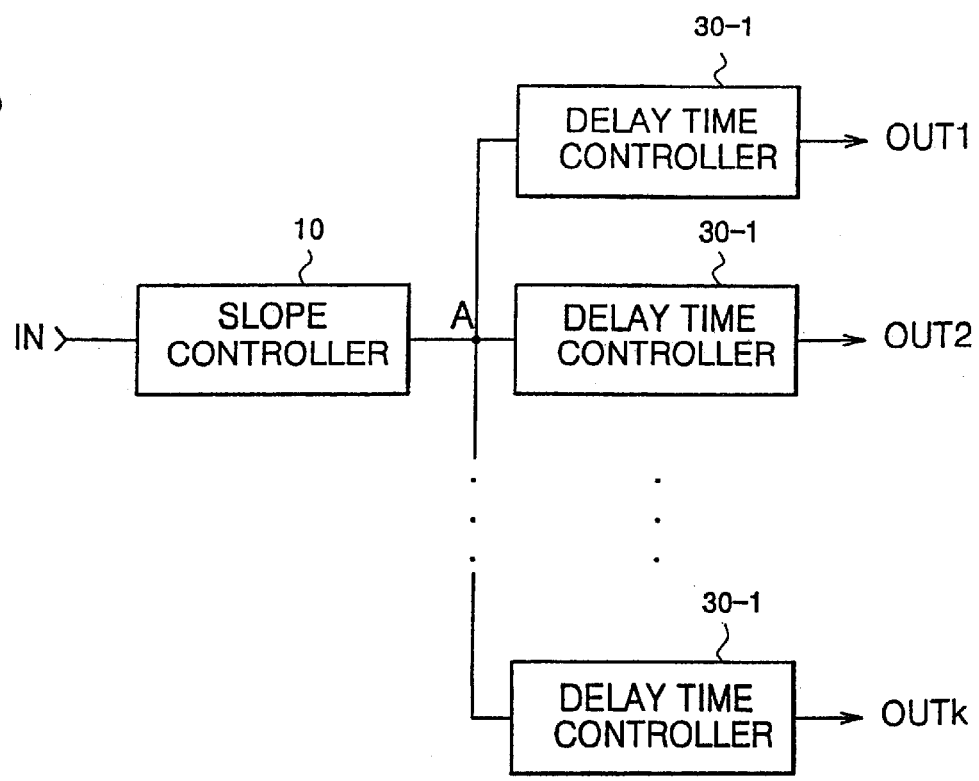
FIG. 8 is a block diagram of another embodiment of a delay circuit in accordance with the present invention.

FIG. 8 is a block diagram of another embodiment of a delay circuit according to the present invention. The delay circuit if FIG. 8 includes a slope controller 10 as in FIG. 2, but also includes k delay time controllers 30-1, 30-2, . . . 30-k. Each of the delay time controllers 30-1, 30-2, . . . 30-k can include a predetermined number of tri-state inverters connected in parallel for operating in response to select signals.

The slope controller 10 generates an intermediate signal A with a variable slope in response to an input signal IN. The delay time controllers 30-1, 30-2, . . . 30-k generate output signals OUT1, OUT2, . . . OUTk, respectively, having different delay times in response to the intermediate signal A.

If the lines between the slope controller 10 and the delay time controllers 30-1, 30-2, . . . 30-k have different lengths, the parasitic capacitances of the lines have different values, so the propagation delay times of the signals traveling from the slope controller 10 to the delay time controllers 30-1, 30-2, . . . 30-k are different. If all of the delay time controllers 30-1, 30-2, . . . 30-k have the same delay time, then the edges of the output signals OUT1, OUT2, OUTk generated in response to a single edge of the signal A from the slope controller 10, will occur at different points in time. However, by adjusting the delay times of the different delay time controllers 30-1, 30-2, . . . 30-k, the edges of the output signals OUT1, OUT2, . . . OUTk can be synchronized to occur at the same time. Thus, output signals at different locations on a semiconductor device can be synchronized regardless of how far they are from an input signal source.

If the embodiment shown in FIG. 8 is used, for example, on a semiconductor memory device, a signal such as a sense amplifier enable signal can be distributed to different locations throughout the chip, and the signal can be synchronized at each location it is used, regardless of how far it is from the source of the sense amplifier enable signal. Accordingly, a semiconductor memory device adopting the delay circuit as described above can utilized the high-resolution delay adjustment to perform high speed operations by controlling the enable time of the same control signals as a control signal for controlling a data output buffer and a sense amplifier enable control signal.

When a delay circuit according to the present invention is adapted to a semiconductor memory device, the operation to select the most appropriate delay time can performed by changing the state of the control signals, thereby providing very minute changes to delay times, and the control signals can is fixed before packaging the semiconductor memory device.

Having described and illustrated the principles of the invention in a preferred embodiment thereof, it should be apparent that the invention can be modified in arrangement and detail without departing from such principles. We claim all modifications and variations coming within the spirit and scope of the following claims.

What is claimed is:

1. A delay circuit comprising:
   a slope controller for generating an intermediate signal responsive to an input signal, wherein the slope controller is constructed so as to control the slope of the intermediate signal responsive to one or more first select signals; and
   a delay time controller coupled to the slope controller for generating an output signal responsive to the intermediate signal, wherein the delay time controller is constructed so as to generate an edge in the output signal responsive to the intermediate signal reaching a threshold level;
   wherein the delay time controller is constructed so as to control the threshold level responsive to one or more second select signals.

2. A delay circuit according to claim 1 further comprising a capacitor coupled to the slope controller so as to receive the intermediate signal.

3. A delay circuit according to claim 2 wherein the capacitor is coupled to the slope controller through a switch.

4. A delay circuit according to claim 1 wherein the delay time controller is a first delay time controller, and further comprising a second delay time controller coupled to the slope controller for generating a second output signal responsive to the intermediate signal such that the delay time between an edge of the input signal and a corresponding edge of the second output signal depends on the slope of the intermediate signal.

5. A delay circuit according to claim 4 wherein:
   the first delay time controller is coupled to the slope controller through a signal path having a first delay time; and
   the second delay time controller is coupled to the slope controller through a signal path having a second delay time.

6. A delay circuit according to claim 1 wherein:
   the slope controller comprises a plurality of first tri-state inverters coupled in parallel for operating responsive to the one or more first select signals; and
   the delay time controller comprises a plurality of second tri-state inverters coupled in parallel for operating responsive to the one or more second select signals.

7. A delay circuit comprising:
   a slope controller for generating an intermediate signal responsive to an input signal, wherein the slope controller is constructed so as to control the slope of the intermediate signal responsive to one or more first select signals; and
   a delay time controller coupled to the slope controller for generating an output signal responsive to the intermediate signal, wherein the delay time controller is constructed such that the delay time between an edge of the input signal and a corresponding edge of the output signal depends on the slope of the intermediate signal;
   wherein the slope controller comprises a plurality of tri-state inverters coupled in parallel for operating responsive to the one or more first select signals.

8. A delay circuit according to claim 7 wherein each of the tri-state inverters comprises:
   first and second pull-up transistors coupled in series between an output terminal and a first power supply terminal;
   first and second pull-down transistors coupled in series between the output terminal and a second power supply terminal;
   wherein the first pull-up transistor and the first pull-down transistor are enabled responsive to one of the one or more first select signals; and
   wherein the second pull-up transistor and the second the pull-down transistor drive the output terminal responsive to the input signal.

9. A delay circuit according to claim 8 wherein:
   the pull-up transistors in each inverter are the same size; and
   the pull-down transistors in each inverter are different sizes.

10. A delay circuit according to claim 8 wherein:
    the pull-up transistors in each inverter are different sizes; and
    the pull-down transistors in each inverter are the same size.

11. A semiconductor memory device comprising a plurality of signal delay circuits, wherein each of said signal delay circuits comprises:
    a slope controller for generating an intermediate signal responsive to an input signal, wherein the intermediate signal has a slope which is controlled responsive to one or more first select signals; and
    a delay time controller coupled to the slope controller for generating an output signal responsive to the intermediate signal;
    wherein the delay time controller is constructed so as to generate an edge in the output signal responsive to the intermediate signal reaching a threshold level; and
    wherein the delay time controller is constructed so as to control the threshold level responsive to one or more second select signals.

12. A semiconductor memory device according to claim 11 further comprising a capacitor coupled to the slope controller so as to receive the intermediate signal.

13. A semiconductor memory device according to claim 12 wherein the capacitor is coupled to the slope controller through a switch.

14. A semiconductor memory device according to claim 11 wherein the delay time controller is a first delay time controller, and further comprising a second delay time controller coupled to the slope controller for generating a second output signal responsive to the intermediate signal;
    wherein the second delay time controller is constructed so as to generate an edge in the second output signal responsive to the intermediate signal reaching a second threshold level; and
    wherein the second delay time controller is constructed so as to control the second threshold level responsive to one or more second select signals.

15. A semiconductor memory device according to claim 14 wherein:
    the first delay time controller is coupled to the slope controller through a signal path having a first delay time; and
    the second delay time controller is coupled to the slope controller through a signal path having a second delay time.

16. A semiconductor memory device according to claim 11 wherein the slope controller is constructed so as to control the slope of the intermediate signal responsive to one or more second select signals.

17. A semiconductor memory device comprising a plurality of signal delay circuits, wherein each of said signal delay circuits comprises:

a slope controller for generating an intermediate signal responsive to an input signal, wherein the intermediate signal has a slope; and a delay time controller coupled to the slope controller for generating an output signal responsive to the intermediate signal;

wherein the delay time controller is constructed such that the delay time between an edge of the input signal and a corresponding edge of the output signal depends on the slope of the intermediate signal;

wherein the delay time controller is constructed such that it controls the delay time between the edge of the input signal and the corresponding edge of the output signal responsive to one or more first select signals; and wherein the delay time controller comprises a plurality of tri-state inverters coupled in parallel for operating responsive to the one or more first select signals.

18. A semiconductor memory device according to claim 17 wherein each of the tri-state inverters comprises:

first and second pull-up transistors coupled in series between an output terminal and a first power supply terminal;

first and second pull-down transistors coupled in series between the output terminal and a second power supply terminal;

wherein the first pull-up transistor and the first pull-down transistor are enabled responsive to one of the one or more first select signals; and wherein the second pull-up transistor and the second the pull-down transistor drive the output terminal responsive to the input signal.

19. A semiconductor memory device according to claim 18 wherein:

the pull-up transistors in each inverter are the same size; and the pull-down transistors in each inverter are different sizes.

20. A semiconductor memory device according to claim 18 wherein:

the pull-up transistors in each inverter are different sizes; and the pull-down transistors in each inverter are the same size.

21. A semiconductor memory device comprising a plurality of signal delay circuits, wherein each of said signal delay circuits comprises:

a slope controller for generating an intermediate signal responsive to an input signal, wherein the intermediate signal has a slope; and a delay time controller coupled to the slope controller for generating, an output signal responsive to the intermediate signal;

wherein the delay time controller is constructed such that the delay time between an edge of the input signal and a corresponding edge of the output signal depends on the slope of the intermediate signal;

wherein the delay time controller is constructed such that it controls the delay time between the edge of the input signal and the corresponding edge of the output signal responsive to one or more first select signals;

wherein the slope controller is constructed so as to control the slope of the intermediate signal responsive to one or more second select signals; and wherein:

the delay time controller comprises a plurality of first tri-state inverters coupled in parallel for operating responsive to the one or more first select signals; and the slope controller comprises a plurality of second tri-state inverters coupled in parallel for operating responsive to the one or more second select signals.

22. A delay circuit comprising:

slope controller means for generating an intermediate signal responsive to an input signal, wherein the intermediate signal has a slope, wherein the slope controller means varies the slope of the intermediate signal responsive to one or more first select signals; and delay time controller means coupled to the slope controller for generating an output signal responsive to the intermediate signal, wherein the delay time controller means is constructed so as to generate an edge in the output signal responsive to the intermediate signal reaching a threshold level;

wherein the delay time controller means is constructed so as to control the threshold level responsive to one or more second select signals.

23. A delay circuit comprising:

slope controller means for generating an intermediate signal responsive to an input signal, wherein the intermediate signal has a slope; and delay time controller means coupled to the slope controller for generating an output signal responsive to the intermediate signal, wherein the delay time between an edge of the input signal and a corresponding edge of the output signal depends on the slope of the intermediate signal;

wherein the slope controller means varies the slope of the intermediate signal responsive to one or more select signals; and wherein the slope controller means comprises a plurality of tri-state inverters coupled in parallel for operating responsive to the one or more select signals.

24. A delay circuit comprising:

slope controller means for generating an intermediate signal responsive to an input signal, wherein the intermediate signal has a slope; and delay time controller means coupled to the slope controller for generating an output signal responsive to the intermediate signal, wherein the delay time between an edge of the input signal and a corresponding edge of the output signal depends on the slope of the intermediate signal;

wherein the slope controller means varies the slope of the intermediate signal responsive to one or more select signals; and wherein the slope controller means comprises a plurality of Schmitt triggers coupled in parallel for operating responsive to the one or more select signals.

25. A delay circuit comprising:

slope controller means for generating an intermediate signal responsive to an input signal, wherein the intermediate signal has a slope; and delay time controller means coupled to the slope controller for generating an output signal responsive to the intermediate signal, wherein the delay time between an edge of the input signal and a corresponding edge of the output signal depends on the slope of the intermediate signal;

wherein the delay time controller means varies the delay time between the edge of the input signal and the corresponding edge of the output signal responsive to one or more select signals; and wherein the delay time controller means comprises a plurality of tri-state inverters coupled in parallel for operating responsive to the one or more select signals.

26. A delay circuit comprising:

slope controller means for generating an intermediate signal responsive to an input signal, wherein the intermediate signal has a slope; and delay time controller means coupled to the slope controller for operating an output signal responsive to the intermediate signal, wherein the delay time between an edge of the input signal and a corresponding edge of the output signal depends on the slope of the intermediate signal;

wherein the delay time controller means varies the delay time between the edge of the input signal and the corresponding edge of the output signal responsive to one or more select signals; and wherein the delay time controller means comprises a plurality of Schmitt triggers coupled in parallel for operating responsive to the one or more select signals.

* * * * *

UNITED STATES PATENT AND TRADEMARK OFFICE
CERTIFICATE OF CORRECTION

PATENT NO. : 6,366,149 B1 Page 1 of 1
DATED : April 2, 2002
INVENTOR(S) : Lee et al.

It is certified that error appears in the above-identified patent and that said Letters Patent is hereby corrected as shown below:

<u>Column 1,</u>
Line 40, "D2..." should read -- D2,... --.

<u>Column 3,</u>
Lines 8-9, "MS2, MSn" should read -- MS2,...MSn --.

<u>Column 9,</u>
Line 55, "generating, an" should read -- generating an --.

<u>Column 11,</u>
Line 12, "for operating" should read -- for generating --.

Signed and Sealed this

Twenty-ninth Day of October, 2002

Attest:

*Attesting Officer*

JAMES E. ROGAN
*Director of the United States Patent and Trademark Office*